(12) United States Patent
Yao et al.

(10) Patent No.: US 11,355,580 B2
(45) Date of Patent: Jun. 7, 2022

(54) LATERAL DMOS DEVICE WITH STEP-PROFILED RESURF AND DRIFT STRUCTURES

(71) Applicant: SEMICONDUCTOR COMPONENTS INDUSTRIES, LLC, Phoenix, AZ (US)

(72) Inventors: Thierry Coffi Herve Yao, Portland, OR (US); Richard De Souza, Happy Valley, OR (US); Troy Darwin Clear, Boring, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/947,564

(22) Filed: Aug. 6, 2020

(65) Prior Publication Data

US 2021/0118987 A1    Apr. 22, 2021

Related U.S. Application Data

(60) Provisional application No. 62/923,087, filed on Oct. 18, 2019.

(51) Int. Cl.
*H01L 29/06* (2006.01)
*H01L 29/66* (2006.01)
*H01L 29/78* (2006.01)
*H01L 21/04* (2006.01)
*H01L 51/00* (2006.01)

(52) U.S. Cl.
CPC ...... *H01L 29/0634* (2013.01); *H01L 21/0415* (2013.01); *H01L 29/66681* (2013.01); *H01L 29/7816* (2013.01); *H01L 51/0011* (2013.01)

(58) Field of Classification Search
CPC ............. H01L 29/0634; H01L 51/0011; H01L 21/415; H01L 29/66681; H01L 29/7816; H01L 29/068; H01L 29/7835; H01L 29/7801
See application file for complete search history.

(56) References Cited

U.S. PATENT DOCUMENTS

| | | | |
|---|---|---|---|
| 7,202,529 B2* | 4/2007 | Krumbein | H01L 29/0634 257/343 |
| 8,704,300 B1* | 4/2014 | Lin | H01L 29/0634 257/335 |
| 2002/0137292 A1* | 9/2002 | Hossain | H01L 29/66659 438/289 |
| 2009/0294849 A1 | 12/2009 | Min et al. | |
| 2013/0234246 A1* | 9/2013 | Yang | H01L 29/66659 257/335 |
| 2015/0014770 A1* | 1/2015 | Parthasarathy | H01L 21/26586 257/339 |

(Continued)

*Primary Examiner* — Galina G Yushina
(74) *Attorney, Agent, or Firm* — Brake Hughes Bellermann LLP

(57) ABSTRACT

A method for fabricating a MOSFET includes forming a source region and a drain region on a surface of a semiconductor substrate, forming a gate region, forming a body diffusion region, forming metal structures, and forming a drift region including an n-type drift structure having a stepped dopant concentration profile with dopant concentrations increasing along a lateral direction from the drain region to the source region of the device.

20 Claims, 16 Drawing Sheets

(56) References Cited

U.S. PATENT DOCUMENTS

| | | | |
|---|---|---|---|
| 2015/0137229 A1* | 5/2015 | Sulistyanto | H01L 29/42368 257/339 |
| 2015/0243766 A1* | 8/2015 | Tu | H01L 29/0653 257/329 |
| 2015/0279969 A1* | 10/2015 | Levy | H01L 21/26513 438/286 |
| 2017/0263766 A1 | 9/2017 | Xia et al. | |

* cited by examiner

LATERAL DMOS DEVICE WITH STEP-PROFILED RESURF AND DRIFT STRUCTURES

RELATED APPLICATION

This application is related to, and claims the benefit of, U.S. Provisional Patent application No. 62/923,087, filed Oct. 18, 2019, which is incorporated by reference in its entirety herein.

TECHNICAL FIELD

This description relates to metal-oxide-semiconductor field-effect transistors (MOSFETs) used for power applications.

BACKGROUND

Lateral double-diffused MOS transistors (LDMOS) can be preferred devices for high-voltage and smart power applications. Whether discreet or embedded in a BCD (BIPOLAR-CMOS-DMOS) technology platform, a main performance metric of a LDMOS device is its specific on-state resistance (Rsp) at a given breakdown voltage (BVdss). Indeed, lower Rsp devices can result in smaller devices which in turn can result in more devices fabricated on a single wafer.

SUMMARY

A lateral double-diffused MOS device (LDMOS) fabricated on a semiconductor substrate has a drift diffusion region that includes a stepped-profile DRIFT structure and a stepped-profile reduced surface field (RESURF) structure. In an n-type LDMOS device, the stepped-profile DRIFT structure is n-type and the RESURF structure is p-type.

In example implementations of the n-type LDMOS device, the stepped-profile DRIFT structure has increasing doping concentration along a lateral or horizontal line going from the drain side to the source side of the device.

In some example implementations of the n-type LDMOS device, the p-type stepped-profile RESURF structure has increasing doping concentration along a lateral line going from the drain side to the source side of the device.

In some example implementations of the n-type LDMOS device, the p-type stepped-profile RESURF structure is at decreasing depth in the semiconductor substrate along the lateral line going from the drain side to the source side of the device.

In example implementations the doping profiles of the stepped-profile DRIFT structure and the stepped-profile RESURF structure may be optimized to minimize the on-state resistance (Rsp) of the device at a given breakdown voltage (BVdss).

DESCRIPTION

Figure 1:
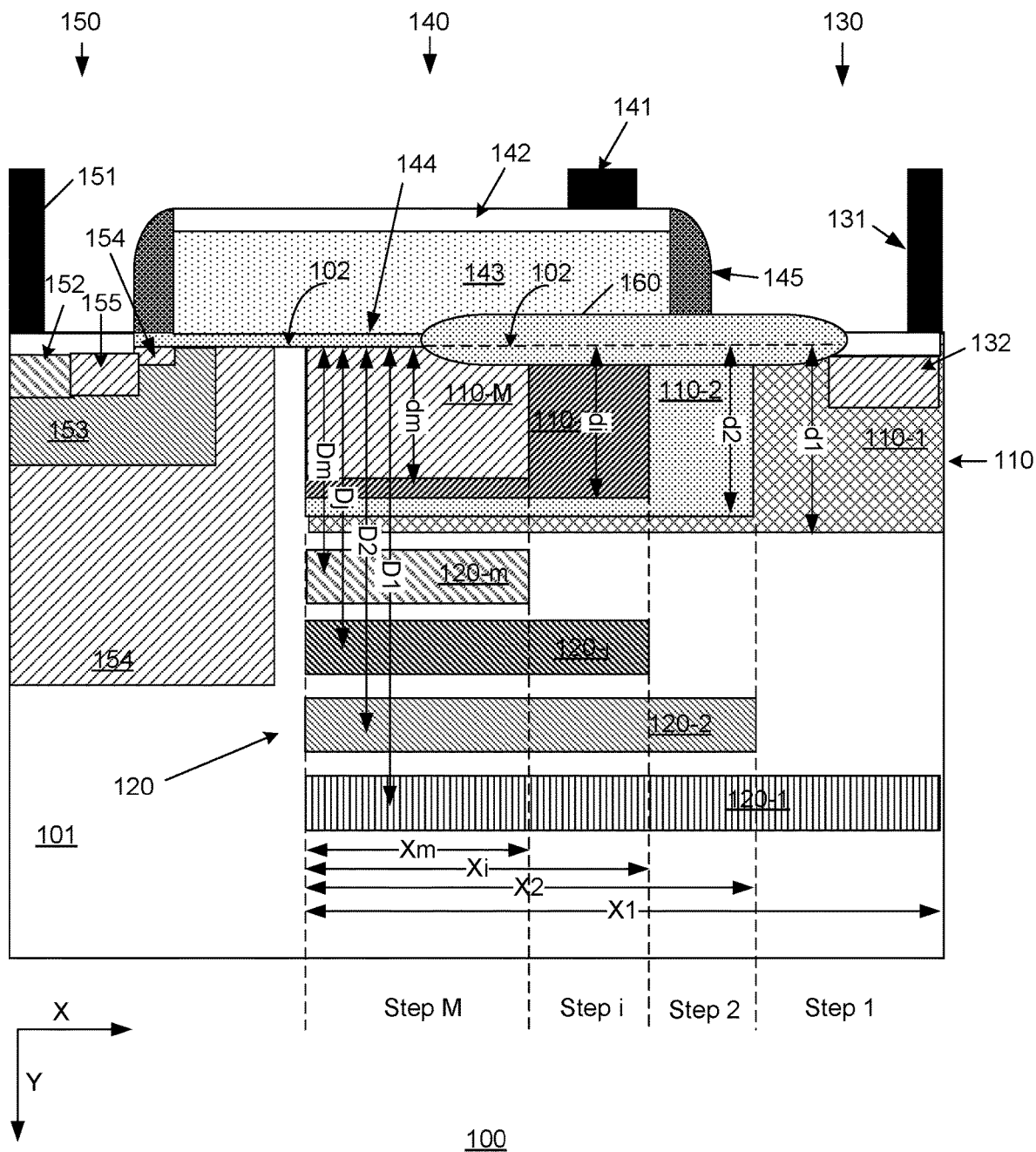
FIG. 1 illustrates a half-pitch cross section of a device cell of an example n-type LDMOS device.

A high-voltage MOSFET device can include thick and low doped epitaxial layers, which can make integration with low-voltage circuitry difficult. Because of the high-resistivity of the thick and low doped epitaxial layers, the on-state resistances of such devices are large. To achieve a lower Rsp, a reduced surface field (RESURF) structure can be used in the device to obtain a fully depleted area in the drift region during a blocking state of a device. The RESURF structure utilizes a lightly doped substrate (e.g., a p-doped substrate) along with a thin epitaxial layer (e.g., an n-type epitaxial layer) to block high voltage in the device. A lateral diode formed by the thin n-type epitaxial layer on the lightly doped p-substrate can have a higher breakdown voltage than a conventional lateral diode without RESURF.

Example LDMOS devices disclosed herein include RESURF structures and DRIFT structures that can significantly improve device performance (e.g., lower Rsp and higher BVdss). Either the RESURF structure or the DRIFT structures (or both) can include stepped dopant concentration profiles. The LDMOS devices can be either n-type (nLDMOS) or p-type (pLDMOS) devices. For brevity, only n-type versions of the devices are described herein with the understanding that n-type and p-type dopants can be swapped to describe the p-type versions of the devices.

An example LDMOS device can have four terminals, for example, drain, gate, source, and body terminals. If the source and body terminals are electrically tied together to make a single terminal (usually called the source) the device may have three terminals i.e., drain, gate, and source terminals.

An example LDMOS device may have a drift diffusion region that includes a RESURF structure having a stepped dopant concentration profile (stepped-profile RESURF structure), and a DRIFT structure having a stepped dopant concentration profile (stepped-profile DRIFT structure).

The stepped-profile RESURF structure may have increasing dopant concentrations along a horizontal or lateral line going from the drain side to the source side of the device, or a decreasing depth of the diffusion along the horizontal or lateral line going from the drain side to the source side, or a combination of the two (i.e., increasing dopant concentration and decreasing depth of diffusion along the lateral line). The stepped-profile DRIFT structure may have an increasing doping concentration along the horizontal or lateral line going from the drain side to the source side of the device. In example implementations, the doping profiles of the RESURF and the DRIFT structures can be designed to maximize breakdown voltage and minimize the resistance of the device.

In example implementations, an nLDMOS device may be fabricated in a BCD technology platform.

In example implementations, an nLDMOS device may include one or more of the following structures:
  a. A resurf oxide between a poly-gate and the drift region
  b. A self-aligned body diffusion region with a link diffusion region on the source side of the device
  c. A butted source-body tied with silicide
  d. A body separated from the source with a field oxide (shallow trench isolation (STI), local oxidation of silicon (LOCOS), etc.)
  e. A buried layer (BL) diffusion region underneath the whole device providing a vertical isolation of the device's body from the substrate.

The diffusion regions (i.e., doped regions) described herein may be formed, for example, by ion implantation followed by thermal diffusion.

In an example, when an nLDMOS device has a BL diffusion region (e.g., an n-type BL (NBL)), the device can be further isolated laterally by an additional doughnut-shaped n-type diffusion region around the device. This additional n-type diffusion region can be deep enough to physically contact the BL diffusion region and shallow enough to physically contact a standard metal contact/silicide/source-drain (SD) structure at the surface of the substrate.

In some implementations, an nLDMOS device can be fabricated on the surface of a p-type doped layer of silicon (e.g., a pEpi layer) grown or deposited on a semiconductor substrate. Two active areas (AAs)—a source active area (AA) and a drain AA, can be formed on the surface of the semiconductor substrate. The two AAs can be laterally separated by the growth or deposition of a relatively thin (e.g., <20 nm) dielectric layer (e.g., gate oxide layer) on the pEpi layer. The two AAs can also be laterally separated by a resurf-oxide layer formed at the surface of the semiconductor substrate as a thicker (e.g., >30 nm) dielectric (e.g., silicon dioxide) layer. In some implementations, the gate oxide layer may have the same thickness as the resurf-oxide layer, and the source AA and the drain AA may be merged into a single AA.

Further in the device fabrication, a gate (e.g., a heavily doped n-type polysilicon polygon) can be formed overlapping a part (but not all) of the source AA and a part of the resurf-oxide layer. A spacer (e.g., a dielectric structure) may be formed all around the gate. A heavily doped n-type diffusion region (typically called nLink or nLDD) may be formed at the surface of the source AA and underneath the spacer.

In example implementations, the nLDD may be provided by the CMOS technology component of the BCD platform on which the device is fabricated, while the nLink may be dedicated to the nLDMOS.

Further, in device fabrication, a source diffusion region (e.g., a heavily doped n-type diffusion region) may be formed through the surface of the source AA and along the spacer, and a body tap diffusion region (e.g., a heavily doped p-type diffusion region) may be formed through the surface of the source AA and along the source diffusion region. In some implementations, the body tap region may contact the source diffusion region. In some implementations, the body tap region may be separated from the source diffusion region by an additional isolation dielectric (e.g., a field oxide such as LOCOS, or a STI) that splits the source AA into two AAs—a source AA and a body AA.

Further, in device fabrication, a drain diffusion region (e.g., a heavily doped n-type diffusion region) may be formed through the surface of the drain AA.

In the device fabrication, metallization structures may be fabricated on surfaces of both the semiconductor substrate and the gate over the following areas: the gate polygon, the drain diffusion region, the source diffusion region, and the body tap region. The metallization structures may include silicide contacts (e.g., metal contact+silicide, etc.) The metal structures may define the gate, drain, source, and body terminals of the nLDMOS device.

In the example implementations in which the body tap region and the source diffusion region touch, the source and body terminals may be tied together as a single source terminal.

Further in the device fabrication, a body diffusion region (e.g., a lightly doped p-type diffusion region) may be formed through the surface of the semiconductor substrate. The body diffusion region may extend vertically from the surface of the semiconductor substrate to reach deeper than the nLink/nLDD, the source diffusion region, and the body tap region, and may extend horizontally (laterally) to enclose the body tap region, the source diffusion region, the nLink/nLDD, and a part of the source AA that is covered by the gate. A part of the body diffusion region overlapped by the gate may form the channel of the device. The channel may have a channel length (Lg). The nLink/nLDD can provide electrical continuity between the channel and the source diffusion region, which in turn can provide electrical continuity to the source terminal.

The body diffusion region may be formed by using a sequence of p-type ion implants through a single mask (e.g., a CMOS pWell mask), or through multiple masks (e.g., CMOS pWell+Self-Align pBody masks).

Further in the device fabrication, a drift diffusion region (nDrift diffusion region) (e.g., a lightly doped n-type diffusion region) may be formed through the surface of the substrate. The nDrift diffusion region may extend vertically from the surface of the substrate to reach deeper than the drain diffusion region and the resurf-oxide layer, and may extend horizontally to enclose the drain diffusion region, the resurf-oxide layer, and at least part of the source AA.

In some implementations, the nDrift diffusion region and the body diffusion region may be in contact. In some implementations, the nDrift diffusion region and the body diffusion region may be separated. In some implementations, the nDrift diffusion region and the body diffusion region may overlap.

The nDrift diffusion region can have a stepped dopant concentration profile, for example, with its doping concentration gradually increasing in a horizontal (lateral) direction from an edge of the drain diffusion region toward the junction of the drain diffusion region with the body diffusion region.

In example implementations, a sequence or chain of n-type implants through partially overlapping masks (e.g., a minimum of two partially overlapping masks) can be used to generate the stepped profile of the nDrift diffusion region. Each nDrift diffusion region may have a width (step) corresponding to an opening of a corresponding mask.

Further in the device fabrication, a resurf diffusion region (pResurf diffusion region) (e.g., a lightly doped p-type diffusion region) may be formed through the surface of the substrate at a depth below the surface. The pResurf diffusion region may be confined to a region deeper than the nDrift diffusion region and may not extend vertically to the surface of the semiconductor substrate. However, in some implementations the pResurf diffusion region may locally crop into the nDrift diffusion region. The pResurf may extend horizontally to enclose the nDrift diffusion region. However, in some implementations, the pResurf diffusion region may overlap the body diffusion region.

The pResurf diffusion region can have a stepped profile, for example, with its doping concentration step-by-step increasing in a horizontal direction from the drain diffusion region toward the body diffusion region. A depth of the pResurf diffusion region in the semiconductor substrate may decrease in the horizontal direction from the drain diffusion region toward the body diffusion region.

In example implementations, a sequence or chain of p-type implants through one mask can be used to generate the stepped profile of the pResurf diffusion region. However, in some implementations, a sequence or chain of p-type implants through multiple masks can be used to generate the stepped profile of the pResurf diffusion region. In some implementations, the masks used to generate the stepped profile of the pResurf diffusion region may be the same as the masks used to generate the nDrift diffusion region.

Further in the device fabrication, the nLDMOS device may be electrically isolated vertically from the pEpi/pSubstrate by a n-type buried layer (nBL) (e.g. a lightly doped buried n-type layer). The nBL may be confined to an area deeper than the pResurf diffusion region and may not extend vertically toward the surface of the semiconductor substrate.

In some implementations, the nBL may extend horizontally across the entire device. In such instances, the device fabrication may include additional lateral isolations surrounding the entire device. In some implementations, the additional lateral isolations may be achieved with a ring shaped n-type diffusion region (e.g., nSinker diffusion region) that surrounds the device. The nSinker diffusion region may extend vertically to the nBL from the surface of the semiconductor substrate, where the nSinker diffusion region can be contacted (e.g., metal contact and silicide, etc.). In some implementations, the additional lateral isolations may be achieved with a deep trench isolation (DTI) structure. In some implementations, the additional lateral isolations may be achieved by combining the DTI and the nSinker diffusion region structures.

FIG. 1 shows a half-pitch cross section of a device cell of an example n-type LDMOS device 100 with p-type stepped-profile RESURF structure 120 and n-type stepped-profile DRIFT structure 110.

For convenience in description, the relative orientations or coordinates of features of device 100 may be described herein with reference to the X axis and Y axis shown, for example, on the page of FIG. 1. The direction parallel to the X axis may be referred to as the horizontal or lateral direction. The direction parallel to the Y axis may be referred to as the vertical direction or depth. Further, for visual clarity, only one half of a device cell of device 100 is shown in FIG. 1. An actual LDMOS device may include tens or hundreds of device cells, which may be obtained, for example, by reflecting and repeating (e.g., in the X direction) the limited half-cell structure shown in FIG. 1.

Device 100 may be fabricated on a BCD technology platform. Device 100 may have a drain structure 130, a gate structure 140 and a source-body structure 150. Device 100 may have three or four terminals (e.g., drain, gate, source, and body terminals). The source and body terminals may be tied together. FIG. 1 shows, for example, device 100 with terminals: drain 131, gate 141 and tied-together source-body terminal 151.

In example implementations, device 100 may be built on a p-type substrate/p-epi/n-buried layer (nBL) substrate (e.g., substrate 101). While nBL may be optional, the nBL may be useful for high voltage switching applications of device 100.

In example implementations, source-body structure 150 (e.g., a low voltage (LV) source) may have a body that includes a p-type well (e.g., pWell 154), a p-type body (e.g., pBody 153) and a p-type source-drain diffusion region (e.g., pSD 152). In example implementations, source-body structure 150 may include a n-type source-drain diffusion region (e.g., nSD 155). In some implementations, the body of source-body structure 150 may include only a p-type well (e.g., pWell 154) and a p-type source diffusion region (e.g., pSD 152).

In example implementations, gate structure 140 of device 100 may include a n-type polysilicon gate (e.g., nPoly 143) and a gate oxide 144 deposited or grown on a silicon surface 102 of substrate 101. Further, a spacer 145 (e.g., a dielectric structure) may be formed all around the gate poly. In some implementations, a channel is formed at silicon surface 102 underneath gate structure 140.

In example implementations, source-body structure 150 (e.g., a low voltage LV source) may have a source that is coupled by a n-type link structure (e.g., nLink 154 underneath spacer 145) to n-type source-drain diffusion region (e.g., nSD 155) for gate area transition. In some implementations, the source of source structure 150 may be coupled by a light doped drain diffusion structure (e.g., nLDD) to n-type source-drain diffusion region (e.g., nSD 155) for gate area transition. The nLDD may be implemented using a CMOS component of the BCD technology platform.

In example implementation, device 100 may include a reduced surface field (resurf) oxide structure (e.g., resurf-oxide 160) at a surface 102 between drain structure 130 and gate structure 140 for reduced surface field effects in device 100. Resurf-oxide 160 may at least partially extend underneath gate structure 140.

In device 100, drain structure 130 may include a n-type source-drain diffusion region (e.g., nSD 132) in low resistivity contact with drain terminal 131. Drain structure 130 further includes one or both of stepped-profile RESURF structure 120 and n-type stepped-profile DRIFT structure 110. In example implementations, reduced surface field effects in device 100 are obtained from the one or both of p-type stepped-profile RESURF structure 120 and n-type stepped-profile DRIFT structure 110 included in the device.

The n-type stepped-profile DRIFT structure 110, which may be fabricated by n-dopant implantations through overlapping masks, may include a series of M nDrift diffusion regions (e.g., region 110-1, region 110-2, region 110-$i$, . . . , and region 110-M, where M is an integer and $i$ is an integer less than M). In example implementations, the M may be two or more. As shown in FIG. 1, the nDrift diffusion regions (e.g., Ndrift diffusion region 110-1, region 110-2, region 110-$i$, . . . , and region 110-M) may have increasing dopant concentrations in a series of M steps (e.g., step 1, step 2, step $i$, . . . , and step M) along a lateral or horizontal line going from the drain side to the source side of the device. For example, a dopant concentration in region 110-2 at step 2 may be greater than a dopant concentration at step 1 in region 110-1, a dopant concentration in region 110-$i$ at step $i$ may be greater than a dopant concentration in region 110-2 at step 2, a dopant concentration in region 110-M at step M may be greater than a dopant concentration in region 110-$i$ at step $i$, etc. The nDrift diffusion region steps (e.g., step 1, step 2, step $i$ and step M) may have horizontal widths (e.g., X1, X2, Xi, . . . , XM, respectively).

In example implementations, the nDrift diffusion regions may extend to different vertical depths in the substrate. For example, Ndrift diffusion region 110-1 at step 1 may extend to a depth d1 below surface 102, region 110-2 at step 2 may extend to a depth d2 below surface 102, region 110-*i* at step i may extend to a depth di below surface 102, and region 110-M at step M may be extend to a depth dm below surface 102. In example implementations, a depth of each of the nDrift diffusion regions (e.g., nDrift diffusion region 110-1, region 110-2, region 110-*i*, . . . , and region 110-M) below surface 102 may decrease (e.g., in steps) in a lateral direction from the drain diffusion region toward the body diffusion region (e.g., d1>d2>di>dm).

The nDrift diffusion regions may overlap and extend horizontally underneath or below each other. For example, region 110-1 (having a width X1 and a depth d1) may extend horizontally underneath region 110-2 (having a width X2<X1 and a depth d2<d1), and region 110-*i* (having a width Xi<X2 and a depth di<d2), etc. Accordingly, a portion of region 110-2 can be disposed between a portion of region 110-*i* and region 110-1. Likewise, a portion of region 110-*i* can be disposed between a portion of region 110-M and region 110-2.

The n-type stepped-profile DRIFT structure 110 may be fabricated by n-dopant implantations through one or more masks. In example implementations, a sequence or chain of n-type implants through partially overlapping masks (e.g., a minimum of two partially overlapping masks) can be used to generate the stepped profile with increasing doping concentration along a lateral or horizontal line going from the drain side to the source side of the device. The nDrift diffusion regions (e.g., Ndrift diffusion region 110-1, region 110-2, region 110-*i*, . . . , and region 110-M) may have horizontal widths (e.g., X1, X2, Xi, . . . , XM, respectively) corresponding to openings of the overlapping masks (not shown) through which the n-dopant implantations are carried out.

The p-type stepped-profile RESURF structure 120, which may be fabricated by p-dopant implantation through one or more masks, may include a series of m pResurf diffusion regions (e.g., pResurf diffusion region 120-1, region 120-2, region 120-*j*, . . . , and region 120-*m*, where m is an integer and j is an integer less than m). In an example implementation, the number m of pResurf diffusion regions in p-type stepped-profile RESURF structure 120 in device 100 may be the same as the number M of nDrift diffusion regions in n-type stepped-profile DRIFT structure 110 (i.e., m=M). Each pResurf diffusion region may be located at a corresponding depth in the substrate. For example, as shown in FIG. 1, pResurf diffusion region 120-1 at step 1 may be at a depth D1 below surface 102, region 120-2 at step 2 may be at a depth D2 below surface 102, region 120-*j* at step i may be at a depth Dj below surface 102, and region 120-*m* at step M may be at a depth Dm below surface 102. In example implementations, a sequence or chain of p-type implants through one or more masks can be used to generate the stepped profile along a lateral line going from the drain side to the source side of the device. A depth of each of the pResurf diffusion regions (e.g., pResurf diffusion region 120-1, region 120-2, region 120-*j*, . . . , and region 120-*m*) below n-type stepped-profile DRIFT region structure 110 may decrease in a lateral direction from the drain diffusion region toward the body diffusion region (e.g., D1 at step 1>D2 at step 2>Dj at step i>Dm at step M).

The reduced surface field effects in device 100 due to the n-type stepped-profile DRIFT region structure 110 and p-type stepped-profile RESURF structure 120 may result in lower Rsp and higher BVdss.

While FIG. 1 illustrates a n-type LDMOS, it will be understood that a p-type LDMOS can be obtained by swapping n- and p-dopant types.

In the example device 100 shown in FIG. 1, n-type stepped-profile DRIFT region structure 110 and p-type stepped-profile RESURF structure 120 may be obtained by implantation through using a common set of overlapping masks. Further, the number M of nDrift diffusion regions may be the same as the number m of pResurf diffusion regions. In other words, each nDrift diffusion region (e.g., Ndrift region 110-1, region 110-2, region 110-*i*, . . . , or region 110-M) may have a corresponding or related pResurf diffusion region (e.g., pResurf region 120-1, region 120-2, region 120-*j*, . . . , or region 120-*m*). The corresponding or related pResurf diffusion regions (e.g., pResurf region 120-1, region 120-2, region 120-*j*, . . . , or region 120-*m*) may have the same widths (e.g., X1, X2, Xi, XM) as the nDrift diffusion regions (e.g., Ndrift region 110-1, region 110-2, region 110-*i*, . . . , and region 110-M).

Figure 2:
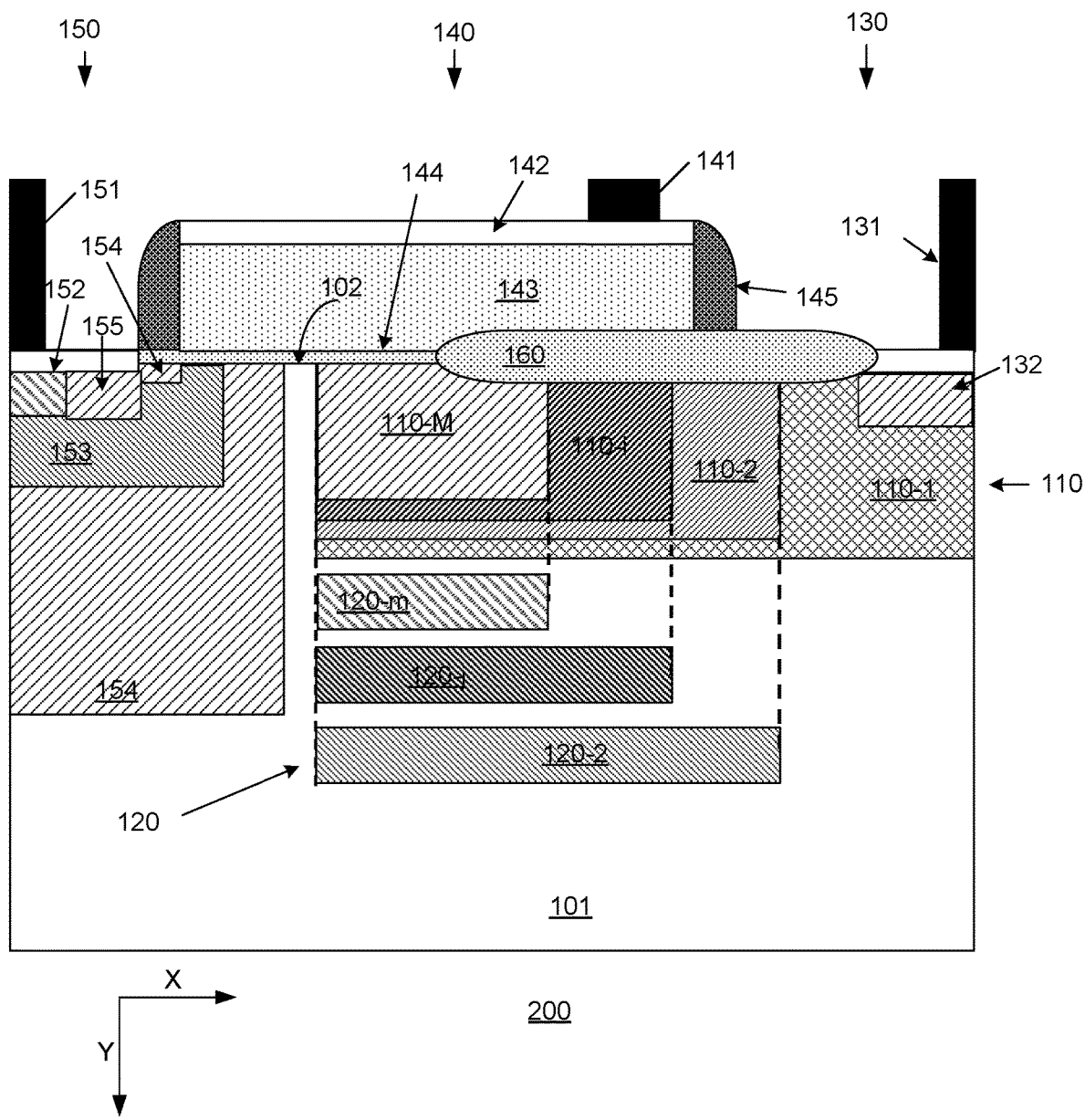
FIG. 2 illustrates an example n-type LDMOS device having different numbers of nDrift diffusion regions and pResurf diffusion regions.

FIG. 2 shows an example device 200 in which the number M of nDrift diffusion regions is different than the number m of pResurf diffusion regions (e.g., M=m+1). In example device 200, for example, the first nDrift diffusion region 110-1 does not have a corresponding pResurf diffusion region (i.e., there is no pResurf diffusion region 120-1 in stepped-profile RESURF structure 120 shown in FIG. 2). Stepped-profile RESURF structure 120 without pResurf diffusion region 120-1 may be obtained, for example, by setting a p-type implant dose for pResurf diffusion region 120-1 to zero when implanting through the common set of overlapping masks to obtain n-type stepped-profile DRIFT structure 110 and p-type RESURF structure 120.

In some implementations, it may not be necessary to implant through a common set of overlapping masks to obtain n-type stepped-profile DRIFT structure 110 and p-type stepped-profile RESURF structure 120. The n-type stepped-profile DRIFT structure 110 and p-type stepped-profile RESURF structure 120 may be obtained by implanting through different sets of masks to obtain different numbers of, or different geometrical configurations of, the Ndrift diffusion regions and pResurf diffusion regions in n-type stepped-profile DRIFT structure 110 and p-type stepped-profile RESURF structure 120, respectively. This geometrical flexibility can provide an additional control parameter for designing the LDMOS device characteristics (e.g., Rsp and BVdss).

Figure 3:
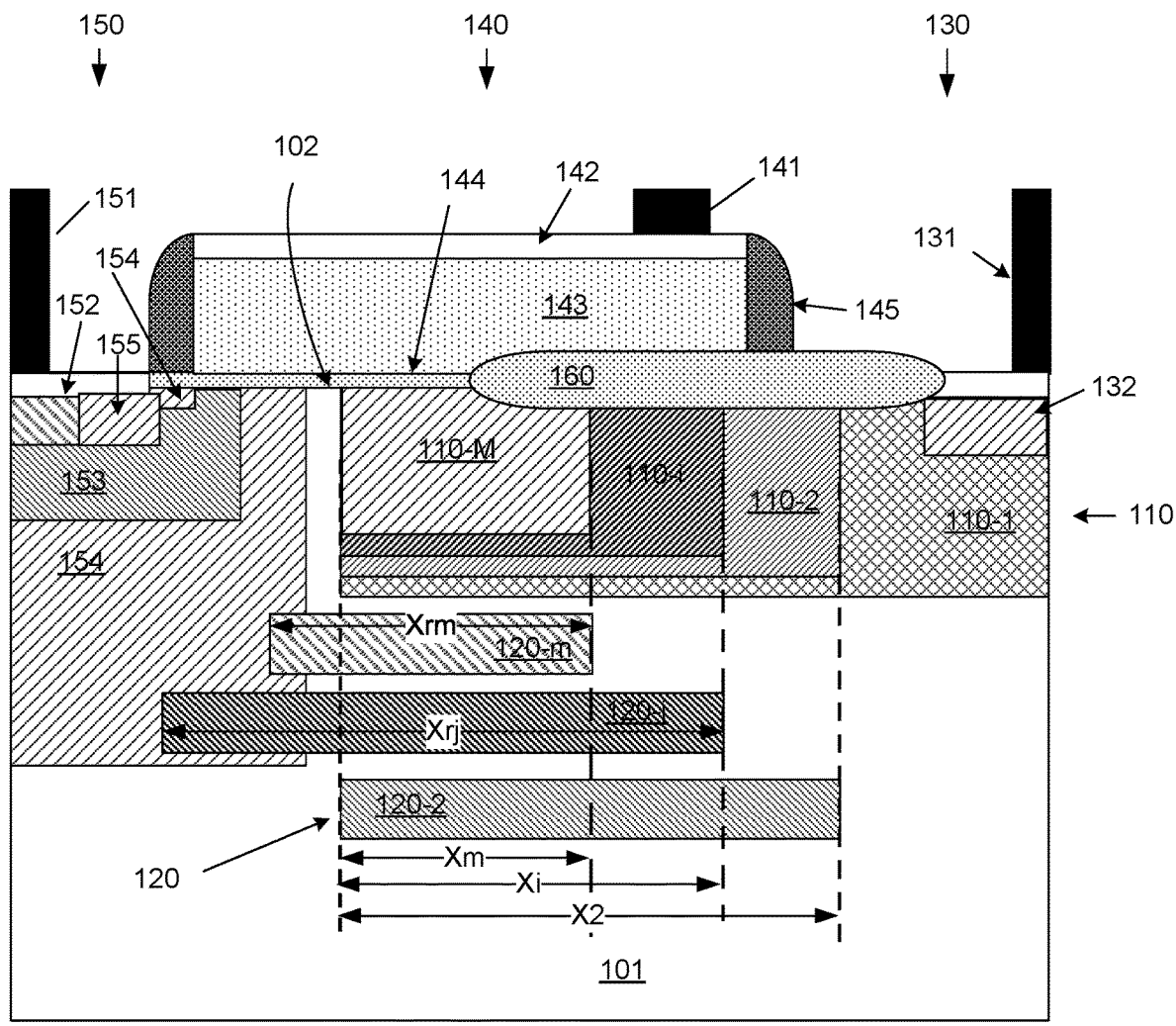
FIG. 3 illustrates an example n-type LDMOS device including a n-type stepped-profile DRIFT structure and a p-type stepped-profile RESURF structure.

FIG. 3 shows an example device 300 in which not only is the number M of nDrift diffusion regions (e.g. M=4) different than the number m of pResurf diffusion regions (e.g., m=3), but also the n-type stepped-profile DRIFT structure 110 and p-type stepped-profile RESURF structure 120 are obtained by implantation through different sets of masks. For example, FIG. 3 shows example device 300 with four nDrift regions (region 110-1, 110-2, 110-I, and 110-M) and only three pResurf2 regions (region 120-2, 120-*j*, and 120-*m*). In the example device 300 shown in FIG. 3, only pResurf2 region 120-2 may be implanted through the same mask as its corresponding nDrift region 110-2. pResurf2 region 120-*j* and region 120-*m* may be implanted through masks that are different than any of the masks used of the four nDrift regions. pResurf2 region 120-2 and corresponding nDrift region 110-2 being implanted through the same mask (opening) may have the same horizontal width (e.g., X2). However, pResurf2 region 120-*m* and region 120-*j* (being implanted through masks that are different than any of the masks used of the four nDrift regions) may have horizontal widths (e.g., Xrm, Xrj) that are different than the widths (Xm, Xi) of corresponding nDrift region 110-M and region 110-*i*.

Figure 4:
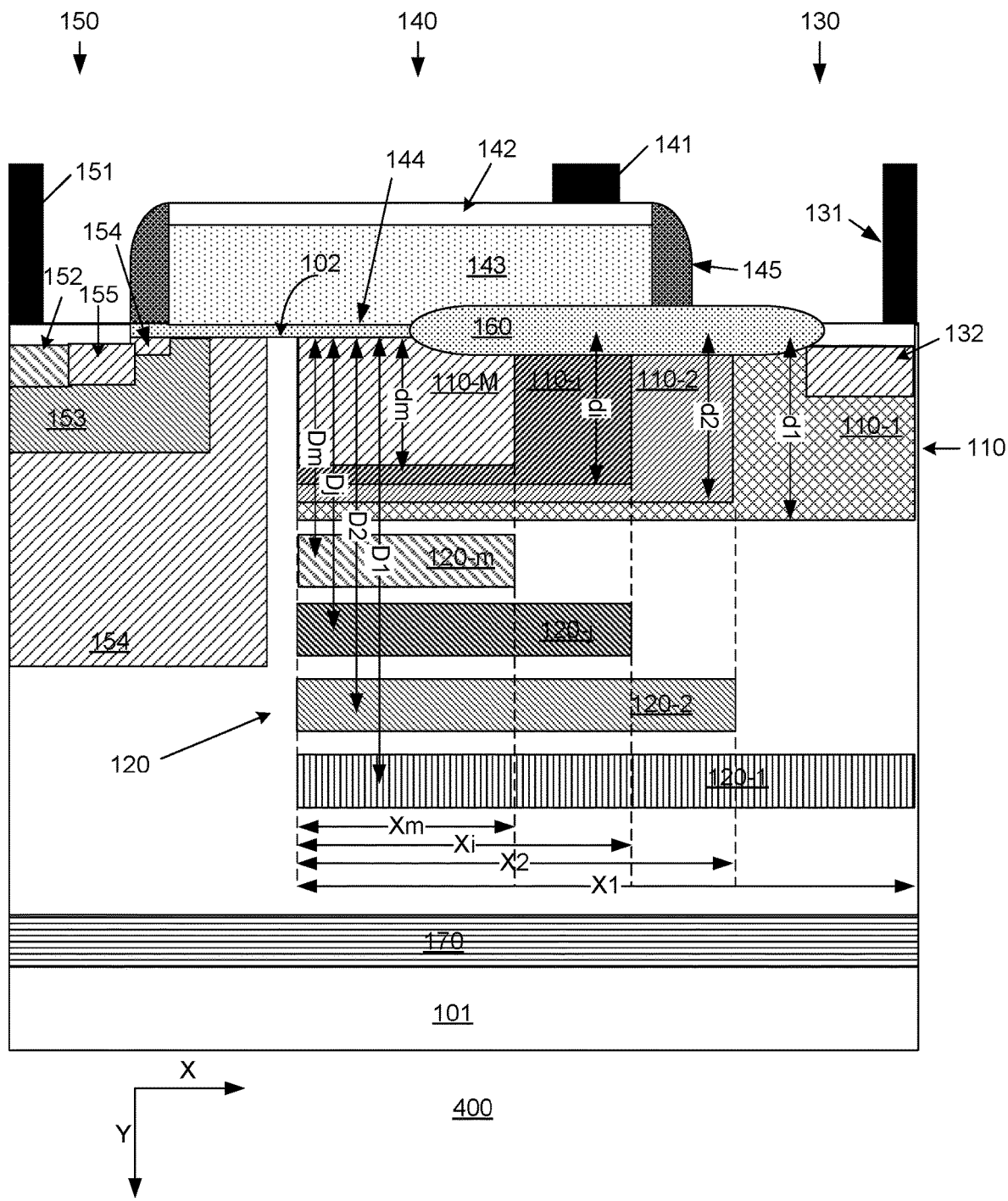
FIG. 4 illustrates an example n-type LDMOS device fabricated on a substrate having an n-type buried layer (nBL).

FIG. 4 shows an example device 400 in which substrate 101 includes a buried n-type buried layer (nBL) 170. The nBL 170 can be a n-type diffusion region that is underneath the device and deeper than pResurf1 (e.g., region 120-1, FIG. 1) and pWell 154. In the example device 400, the nBL diffusion region may form a barrier separating the p-type regions of the device (e.g., pBody 153, pWell 154, and RESURF structure 120) from the pEpi/pSubstrate 101 underneath so that the body of the device can be biased independently of pEpi/pSubstrate 101.

Figure 5:
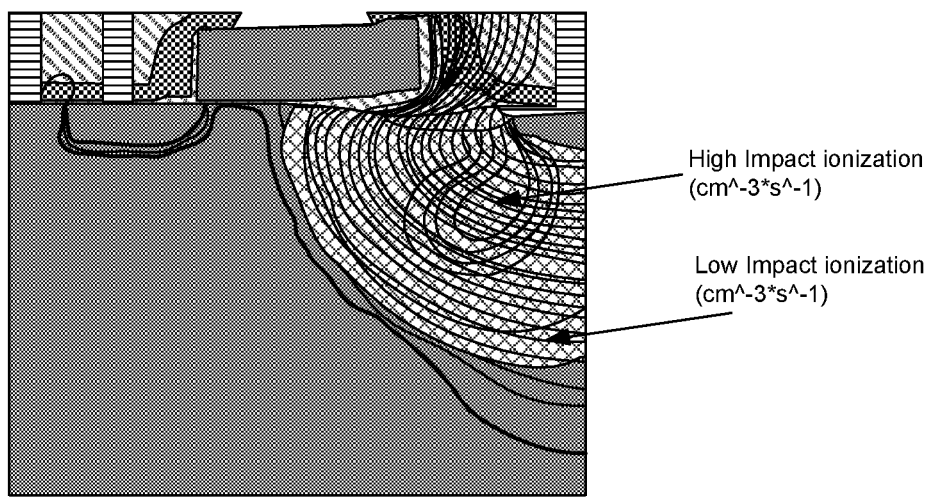
FIG. 5 illustrates a cross sectional view of impact ionization and iso-potential lines of a test device.

FIG. 5 shows a cross sectional view of impact ionization and isopotential lines of a test nLDMOS device obtained by a technology computer-aided design (TCAD) simulation of a test nLDMOS device. The test nLDMOS device has, for example, two pairs of Ndrift diffusion regions and pResurf diffusion regions (i.e., nDRift1/pResurf1 and nDrift2/pResurf2, FIG. 1). Different configurations of implant doses for the nDrift1 region, NDrift2 region, Presurf1 region and Presurf2 region, were considered.

Figure 6:
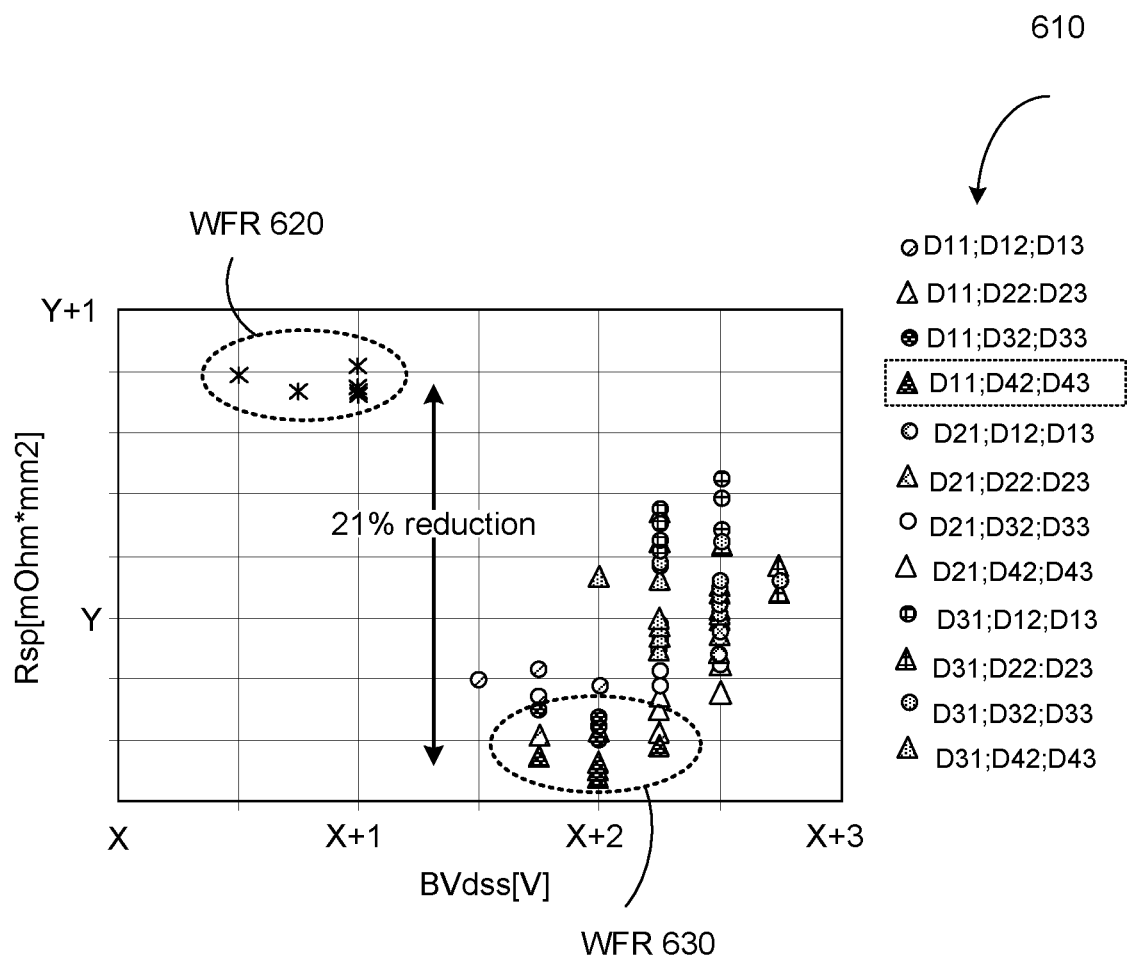
FIG. 6 is graph showing Rsp and BVdss values for various sets of doping concentration values of the test device of FIG. 5.

FIG. 6 is graph showing Rsp and BVdss values obtained for various sets of doping concentration values (i.e., dopant concentration set 610) as the implantation dose for the pResurf1, pResurf2, nDRift1, and nDrift2 regions of the test nLDMOS device. FIG. 6 also shows Rsp and BVdss values obtained for a traditional device (labeled WFR 620). It is seen from the results shown in FIG. 6 that a test nLDMOS device (labeled WFR 630) shows a reduction of about 21% in Rsp value and has a higher BVdss value (e.g., about a 1 V increase) than the traditional device POR WFR 620. The best results for target WFR 630 correspond, for example, to dopant concentration set 610 of D11;D32;D33 and D11; D42;D43 for the pResurf2, nDRift1, and nDrift2 regions.

FIG. 7 through FIG. 15 illustrate schematic views of substrate 101 as it is being processed through multiple steps of an example fabrication process to make an example nLDMOS device (e.g., device 100, FIG. 1).

Figure 7:
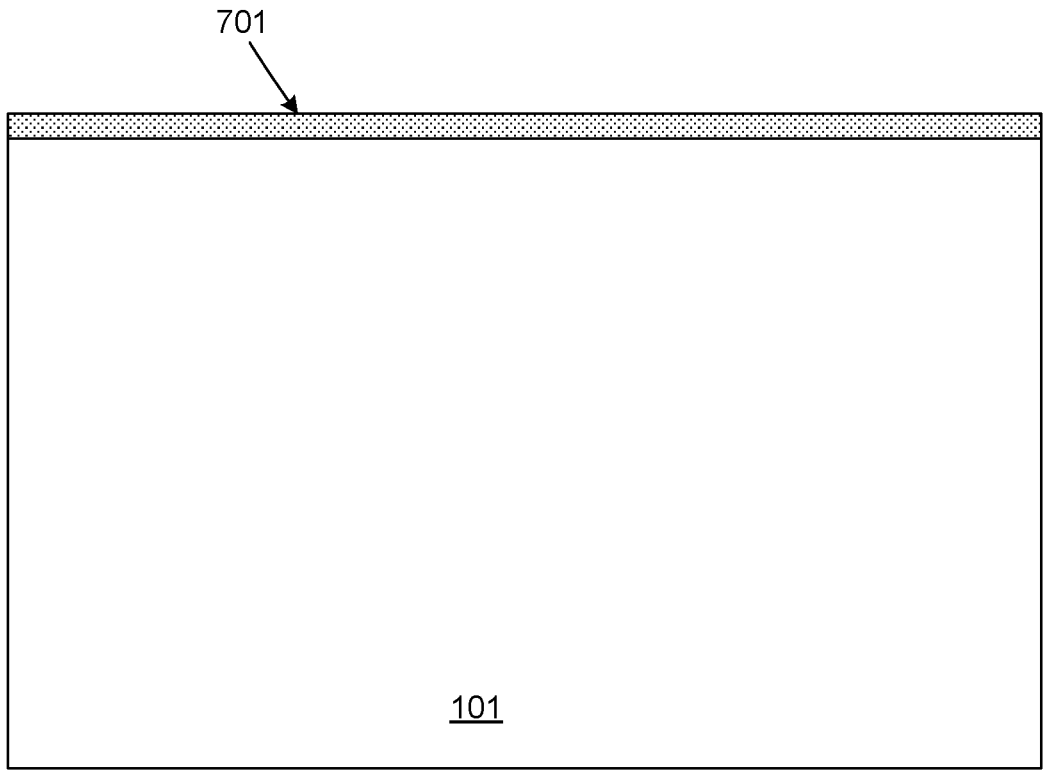
FIGS. 7 through 15 illustrate schematic views of a substrate as it is being processed through multiple steps of an example nLDMOS device fabrication process.

FIG. 7 shows a starting p-type substrate 101, which may have a layer of sacrificial oxide 701 grown on it after pEpi growth, pad oxide growth, and STI formation.

Figure 8:
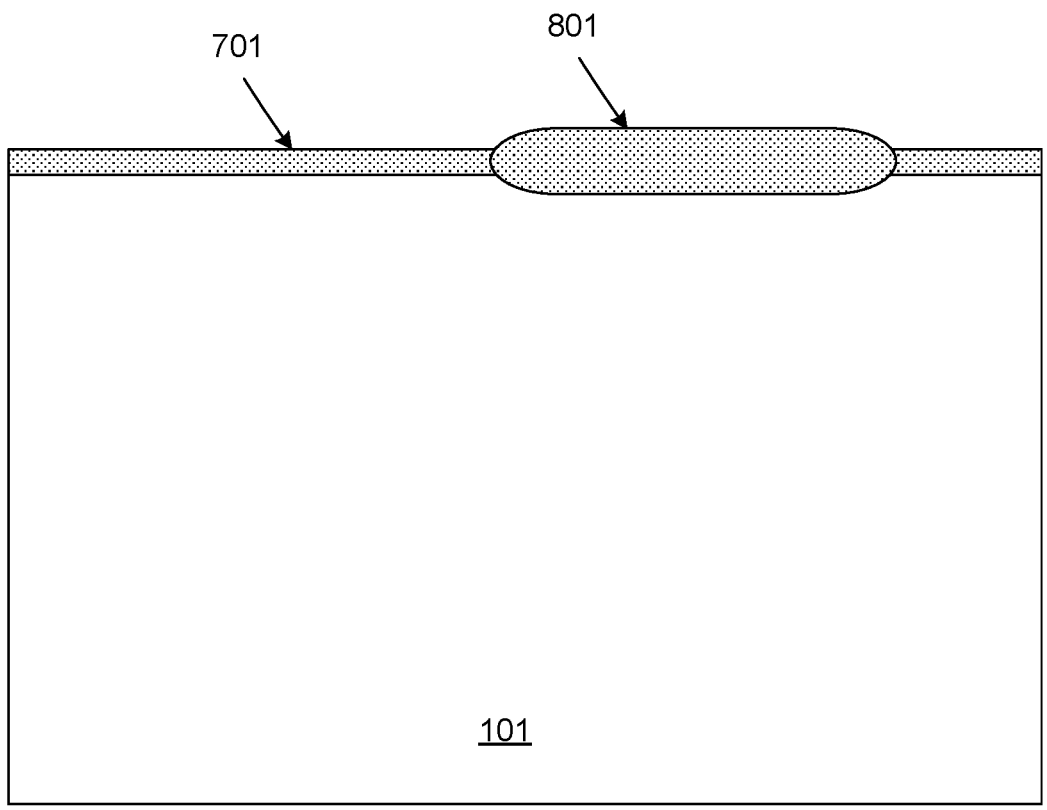

FIG. 8 shows a resurf-oxide layer 801 grown on substrate 101. The growth of the resurf-oxide layer may involve a pad nitride layer deposition, a resurf-oxide lithographic pattern mask, a nitride etch, a resist strip, a resurf-oxide growth, and a nitride strip.

The n-type DRIFT structure 110 and p-type RESURF structure 120 may be formed in substrate 101 by ion implantations through a sequence of one or more resist masks (not shown). In example implementations, a sequence or chain of n-type implants through partially overlapping masks may be used to form n-type DRIFT structure 110. A sequence or chain of p-type implants through the same partially overlapping masks may be used to form p-type RESURF structure 120. For example, a first resist mask may be placed on substrate 101 and n-type ions may be implanted through the mask to form a first Ndrift region of n-type DRIFT structure 110, and p-type ions may be implanted through the same mask to form a first pResurf region of p-type RESURF structure 120. Next, a second resist mask (overlapping the first mask) may be placed on substrate 101. N-type ions may be implanted through the second resist mask to form a second Ndrift region of n-type DRIFT structure 110, and p-type ions may be implanted through the same mask to form a second pResurf region of p-type RESURF structure 120. Further, the processes of implanting n-type ions and p-type ions may be repeated through additional overlapping resist masks placed on the substrate to form additional Ndrift regions and pResurf regions. Implanting n-type ions may precede or succeed implanting p-type ions through each of the resist masks placed on substrate 101.

Figure 9:
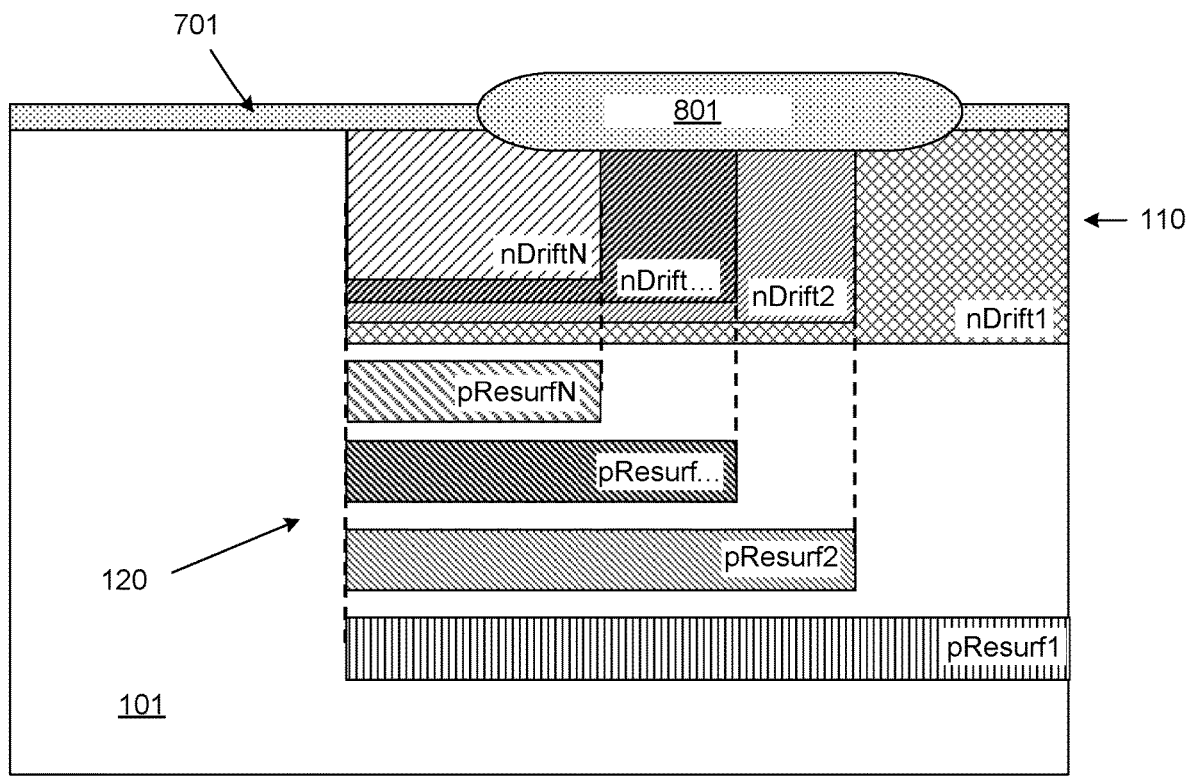

FIG. 9 shows n-type DRIFT structure 110 and p-type RESURF structure 120 formed in substrate 101. N-type DRIFT structure 110 may include multiple ndrift diffusion regions (e.g., Ndrift1, Ndrift2, Ndrift . . . , and NdriftN). P-type RESURF structure 120 may include multiple resurf diffusion regions (e.g., pResurf1, pResurf2, pResurf . . . , and pResurfN). The formation of these structures may involve: nDrift1 masks, nDrift1 implant chain, resurf1 implant chain, and resist strip; . . . ; nDriftN masks, nDriftN implant chain, pResurfN implant chain, and resist strip, etc.

Figure 10:
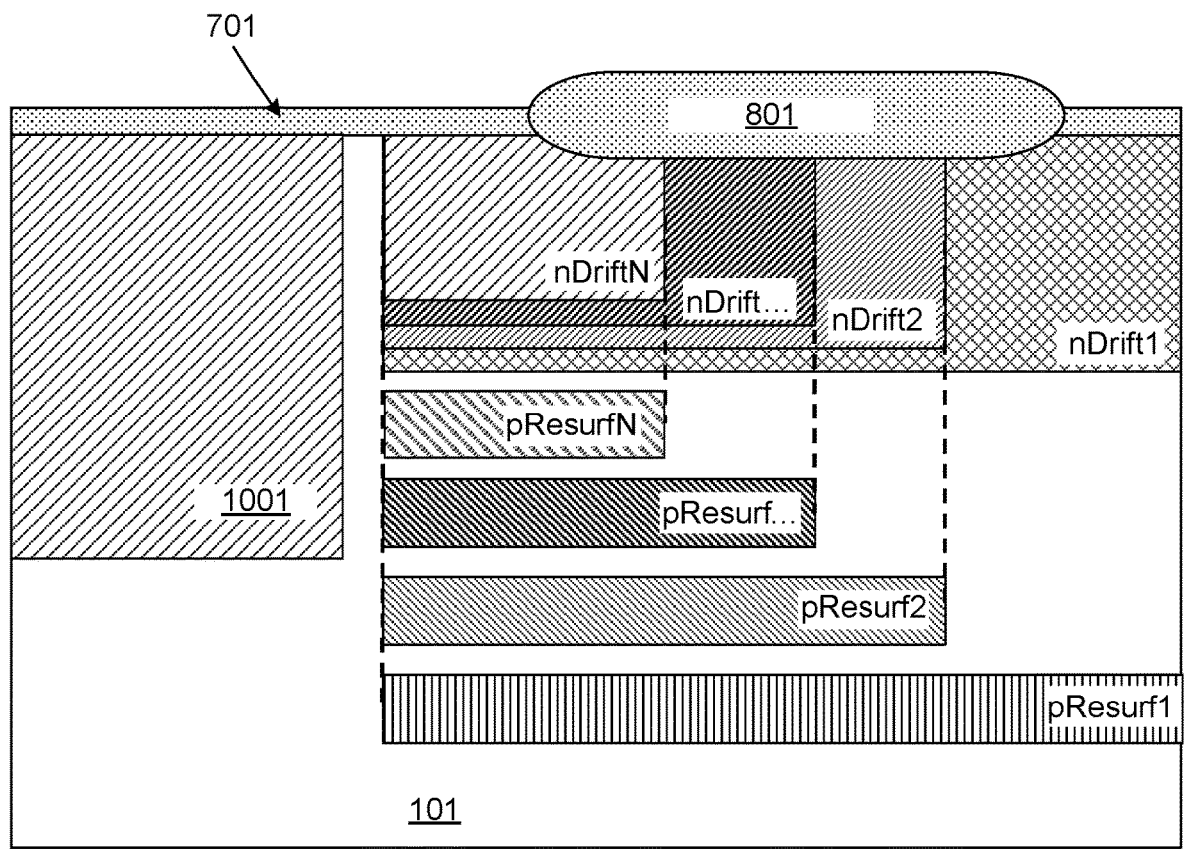

FIG. 10 shows a p-type well 1001 formed in formed in substrate 101. The formation of the p-well may involve: PWell mask, PWell implant, and resist strip.

Figure 11:
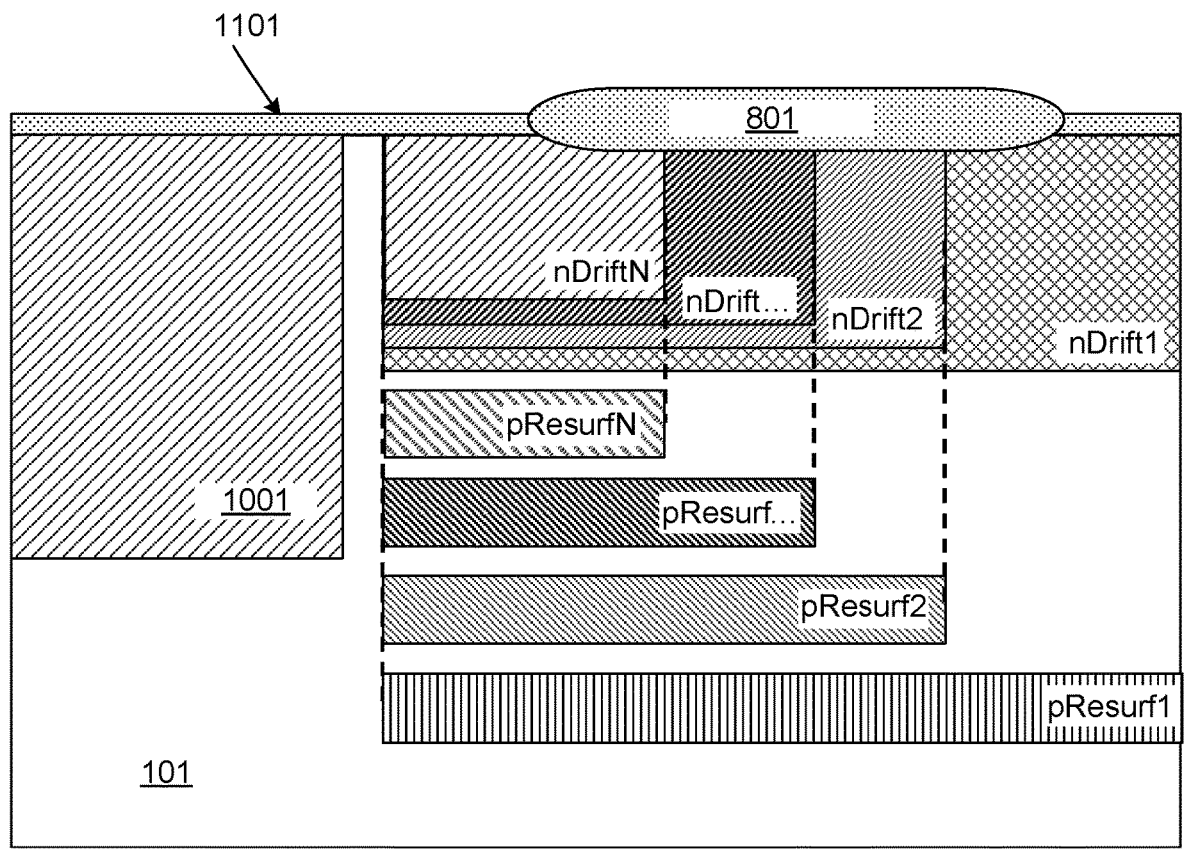

FIG. 11 shows formation of a gate oxide 1101 on a top surface of substrate 101 (after a sacrificial oxide layer strip).

Figure 12:
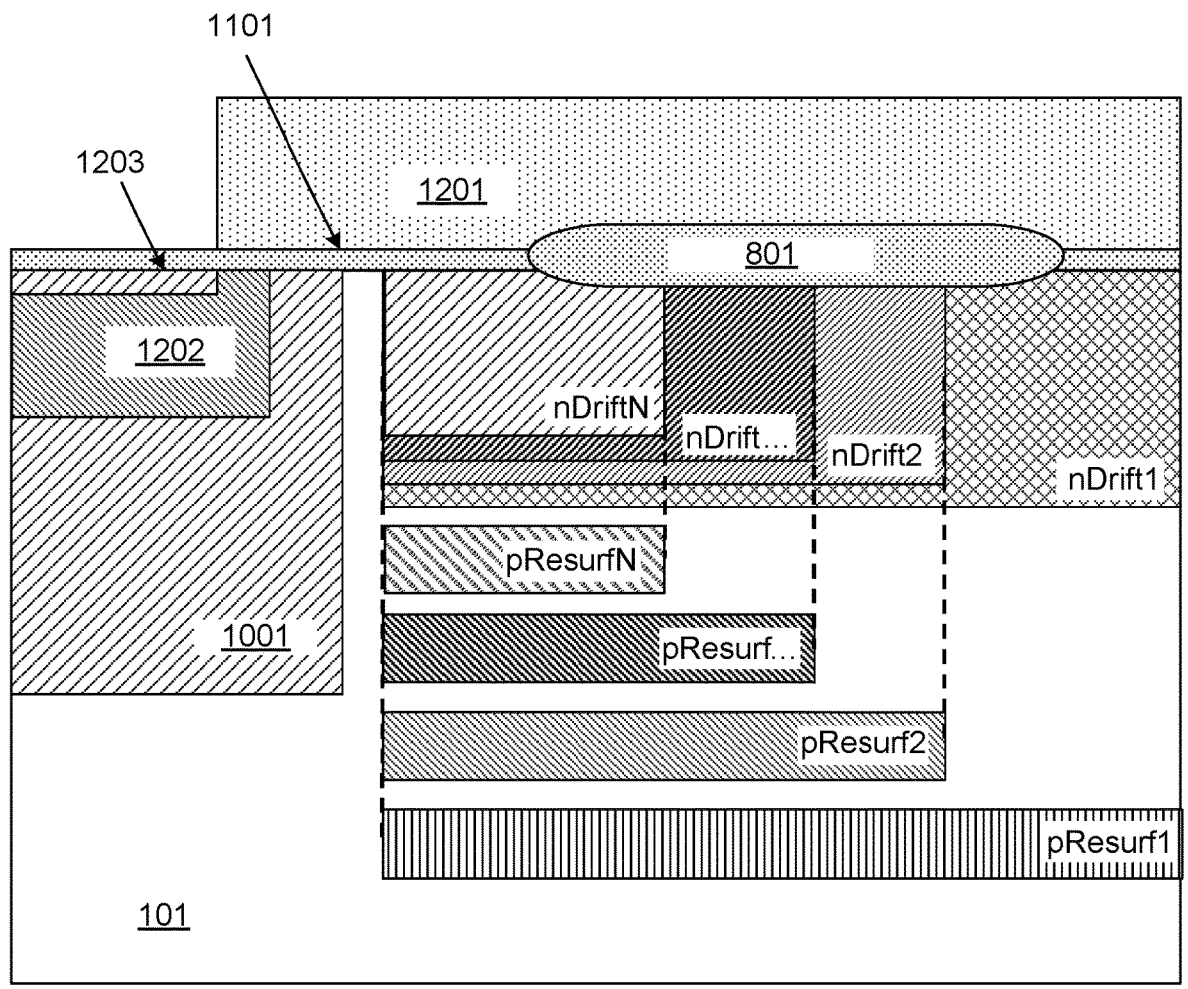

FIG. 12 shows substrate 101 after formation of a precursor structure 1201 for a gate (e.g., nPoly), a structure 1202 for a p body, and a structure 1203 for an nLink in the substrate. The formation of these structures may involve: poly deposition, a self-aligned pBody mask, a poly etch, an nLink implant, a pBody implant, and a resist strip.

Figure 13:
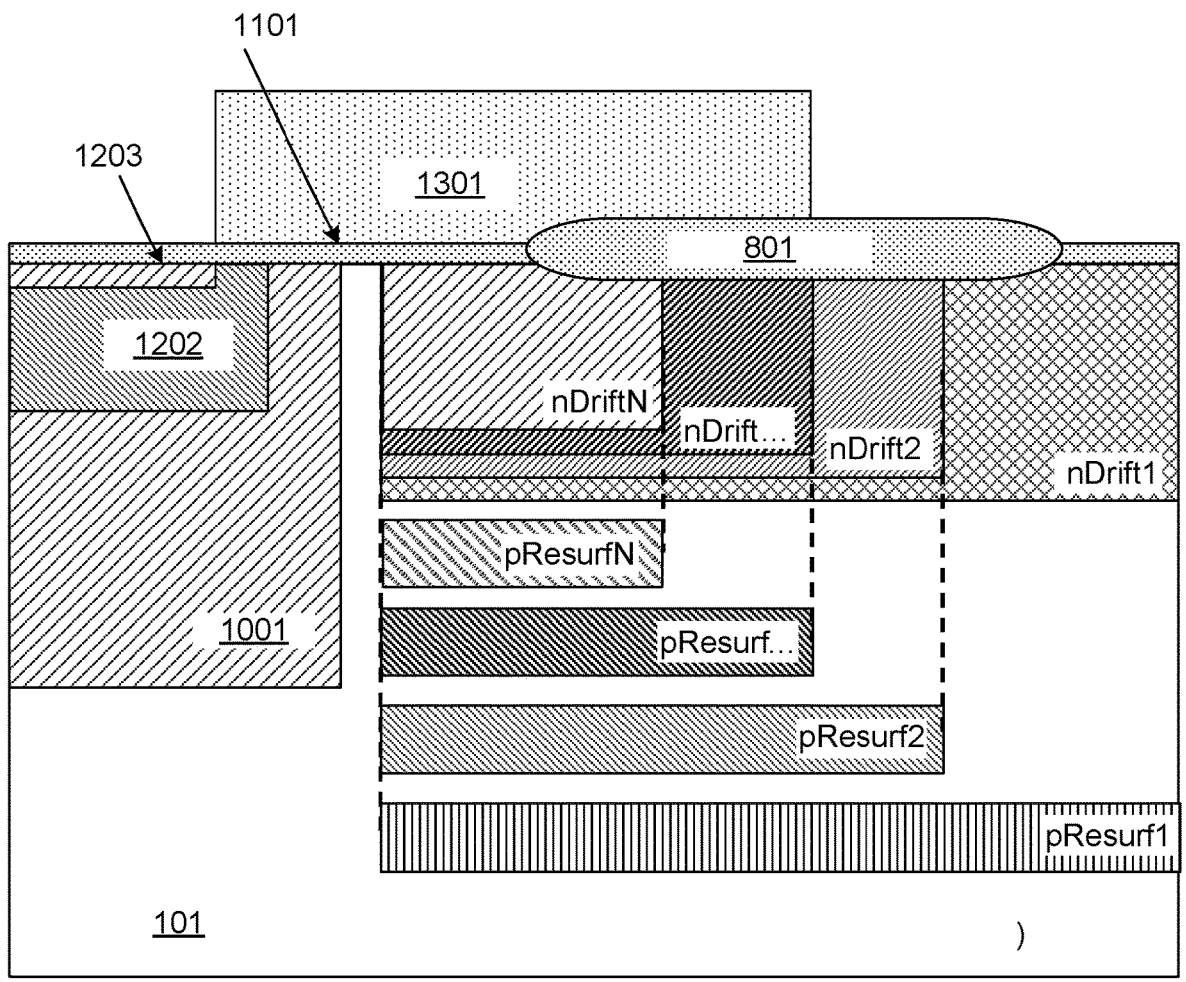

FIG. 13 shows substrate 101 after formation of a gate structure 1301 in substrate 101. The formation of this structure may involve: poly mask, poly etch, and a resist strip.

Figure 14:
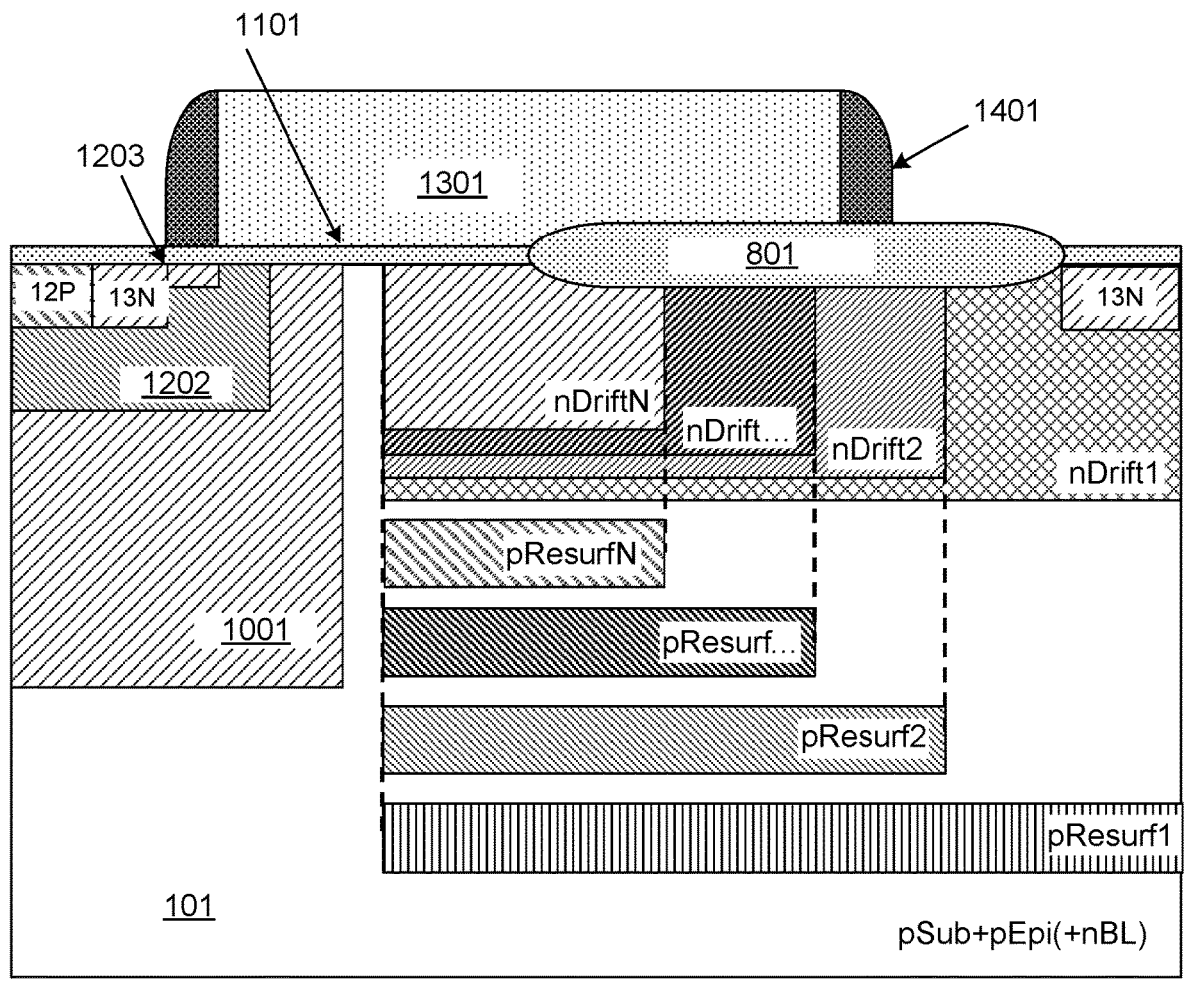

FIG. 14 shows substrate 101 after formation of source and drain structures (e.g., spacer 1401, pSD 12P and nSD 13N) in substrate 101. The formation of these structures may involve: spacer formation, a nSD mask, a nSD implant, a resist strip, a pSD mask, a pSD implant, and a resist strip.

Figure 15:
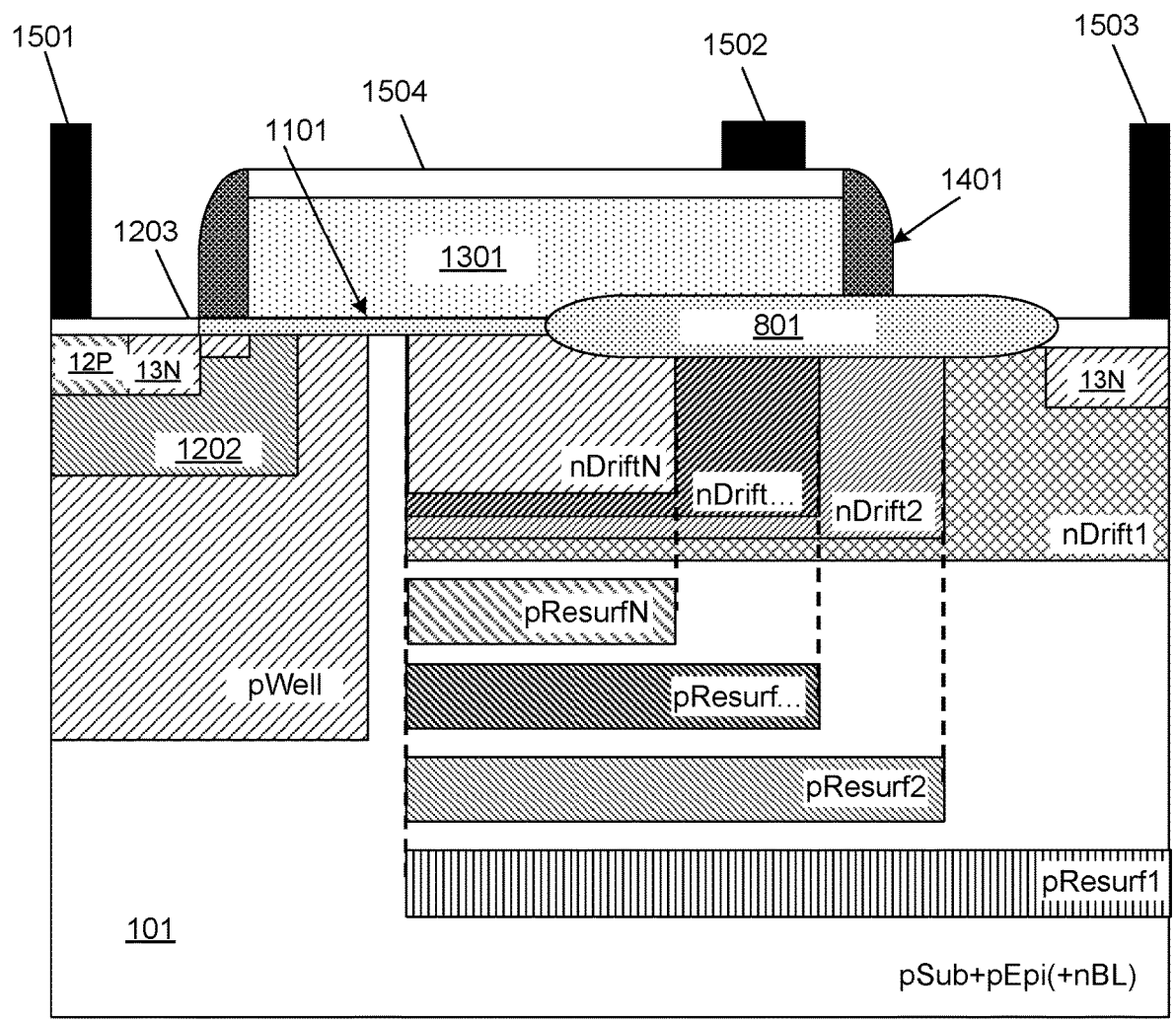

FIG. 15 shows substrate 101 after formation of device terminals (e.g., source terminal 1501, gate terminal 1502 and drain terminal 1503) by back-end metallization processing including a silicide layer 1504. The back-end processing may involve: silicide formation, inter level dielectric (ILD) layer formation, ILD formation, and conductive material or metal contact formation.

Figure 16:
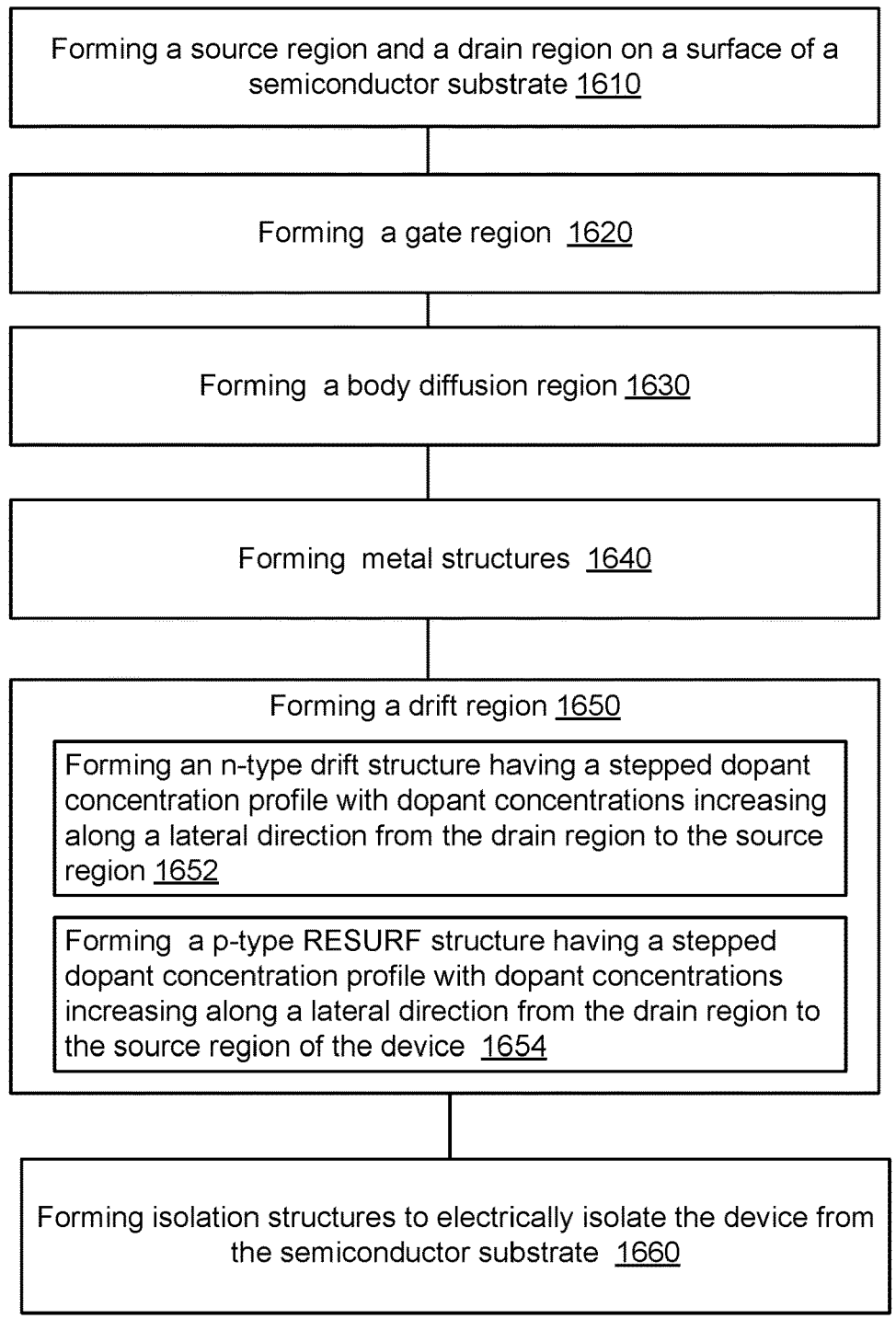
FIG. 16 illustrates an example method for fabricating an nLDMOS device.

FIG. 16 shows an example method 1600 for fabricating a MOSFET device (e.g., a n-type LDMOS) with reduced on-state resistance (Rsp) at a given breakdown voltage (BVdss).

Method 1600 includes forming a source region and a drain region on a surface of a semiconductor substrate (1610); forming a gate region (1620); forming a body diffusion region (1630); forming metal structures (1640); and forming a drift region (1650). The semiconductor substrate may, for example, be a p-type substrate with a p-type doped epilayer of silicon (e.g., pEpi/pSubstrate).

Forming a source region and a drain region 1610 may include forming at the surface of the semiconductor substrate a dielectric layer (e.g., gate-oxide layer less than about 20 nm) and forming a resurf-oxide layer (e.g., a dielectric layer greater than about 30 nm) at the surface of the semiconductor to separate the source region and the drain region.

Forming a gate region 1620 may include forming a gate polygon (e.g., a heavily doped n-type polysilicon layer) to overlap part of but not all of the source region and part of the resurf-oxide layer. Forming the gate region 1620 may further include forming a spacer (i.e., a dielectric structure) around the gate polygon.

Forming the source region and the drain region 1610 may further include: forming a first heavily doped n-type diffusion (typically called nLink or nLDD) at the surface of the source region and underneath the spacer, forming a second heavily doped n-type diffusion (source diffusion) at the surface of the source region and along the spacer, and forming a heavily doped p-type diffusion (body tap) at the surface of the source region and along the source diffusion.

In some example implementations, the body tap diffusion may touch the source diffusion. In some example implementations, the body tap may be separated from the source diffusion by an additional isolation dielectric (e.g., a field-oxide, LOCOS, STI, etc.). The additional isolation dielectric may split the source region in two: a source region and a body region.

Forming the source region and the drain region 1610 may further include forming a heavily doped n-type diffusion (drain diffusion) at a surface of the drain AA.

Forming a body diffusion region 1630 may include forming a lightly doped p-type diffusion (body diffusion) by using a sequence of p-type ion implants through a single mask (e.g., a CMOS pWell mask), or through multiple masks (e.g., CMOS pWell mask+Self-Align pBody mask). The body diffusion region may extend vertically from the surface of the semiconductor substrate to reach deeper than the nLink/nLDD, source diffusion, and body tap. Further, the body diffusion may extend horizontally to enclose the body tap, the source diffusion, the nLink/nLDD, and part of the source region covered by the gate region. The part of the body diffusion region overlapped by the gate region is generally known as the channel and its length (Lg) is generally called the gate length. In example implementations, nLink/nLDD may provide electrical continuity between the channel and the source diffusion.

Forming metal structures 1640 may include forming metal structures at the surface of both the semiconductor substrate and the gate region (e.g., over the gate polygon, the drain diffusion, source diffusion, and body tap). The metal structures may include a silicide layer and metallic or conductive contacts. The metal structures define the terminals of the device (e.g., gate, drain, source, and body terminals). In an example implementation, where the source and body diffusions in the device touch, the source and body terminals may be tied into a single terminal (i.e., the source terminal).

Forming a drift region 1650 may include forming a n-type drift structure having a stepped dopant concentration profile with dopant concentrations increasing along a lateral direction from the drain region to the source region of the device (1652).

Forming the n-type drift structure 1652 may include implanting two or more lightly doped drift diffusion regions (nDrift diffusion regions) through a surface of the semiconductor substrate.

The nDrift diffusion regions may extend vertically from the surface of the semiconductor substrate to reach deeper than the drain diffusion and the resurf-oxide. Further, the nDrift diffusion regions may extend horizontally to enclose the drain diffusion, the resurf-oxide, and at least part of the source region.

In some example implementations, the nDrift diffusion regions and the body diffusion region may touch. In some example implementations, the nDrift diffusion regions and the body diffusion region may be separated, and in some example implementations, the nDrift diffusion regions and the body diffusion region may overlap.

In example implementations, the nDrift diffusion regions may have a dopant concentration profile that is stepped with the dopant concentration in the Ndrift diffusion regions increasing in steps horizontally from an edge of the drain diffusion region to a junction with the body diffusion region. The stepped dopant concentration profile may be formed by a sequence of n-type ions implants through a plurality of overlapping masks. In an example implementation, a minimum of two partially overlapping masks may be used to form the stepped dopant concentration profile (e.g. a dopant concentration profile across two nDrift diffusion regions with one intermediate dopant concentration step).

Forming the drift region 1650 may further include forming a p-type RESURF structure having a stepped dopant concentration profile with dopant concentrations increasing along a lateral direction from the drain region to the source region of the device (1654).

The p-type RESURF structure may include one or more pResurf diffusion regions. The one or more pResurf diffusion regions may be confined to a region deeper than the nDrift diffusion regions and may not extend vertically to the surface of the semiconductor substrate. In some implementations, a pResurf diffusion region may locally crop into the nDrift diffusion.

Further, the pResurf diffusion regions may extend horizontally to enclose the nDrift diffusion regions. In some implementations, a pResurf diffusion region may overlap with the body diffusion region.

In example implementations, the pResurf diffusion regions may have a dopant concentration profile that is stepped with the dopant concentration increasing in steps in horizontal direction from underneath the drain diffusion toward the body diffusion. In some implementations, a depth of the pResurf diffusion regions may decrease in steps in a horizontal direction from underneath the drain diffusion toward the body diffusion.

In some example implementations, the stepped dopant concentration profile of the pResurf diffusion regions may be formed by a sequence of p-type ion implants through a single mask or through multiple masks.

In some example implementations, the stepped dopant concentration profile of the pResurf diffusion regions may be formed by a sequence of p-type ion implants through the same overlapping masks used for the sequence of n-type ion implants for the stepped dopant concentration profile of the nDrift diffusion regions.

In an example implementation, the number of overlapping masks may be two. Implantation through the two overlapping masks may result in the stepped dopant concentration profile of the nDrift diffusion region having two diffusion regions (with a step in the dopant concentration between the two diffusion regions).

Method 1600 may further include forming isolation structures to electrically isolate the device from the substrate (1660). In example implementations, forming the isolation structures 1660 may include forming a lightly doped buried n-type diffusion (nBL). The nBL may, for example, electrically isolate an nLDMOS device vertically from the pEpi/pSubstrate.

The nBL may extend horizontally to enclose the entire device. In example implementations, the nBL is confined to an area deeper than the pResurf diffusion regions and does not extend vertically to the surface of the semiconductor substrate. In some example implementations, a pResurf diffusion region may locally crop into nBL.

Further, forming the isolation structures 1660 may include forming additional lateral isolations surrounding the entire device. Forming the additional lateral isolations may include forming a n-type diffusion region (nSinker). The nSinker may be a ring shaped diffusion region that surrounds the device and extends vertically from the surface of the substrate to the nBL. The nSinker may be contacted at the surface of the substrate by the metal structures (e.g., metal contact, silicide layer, etc.).

In some example implementations, forming the additional lateral isolations may include forming a deep trench structure (DTI), or combing DTI with nSinker for lateral isolation.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A lateral MOSFET, comprising:
   a substrate;
   a source;
   a gate;
   a drain; and
   a drift region extending from the source to the drain, the drift region including a drift structure including a series of overlapping diffused-dopant regions having a stepped dopant concentration profile with dopant concentrations increasing along a lateral direction from the drain to the source.

2. The lateral MOSFET of claim 1, wherein a number of overlapping diffused-dopant regions in the series of overlapping diffused-dopant regions in the drift structure is equal to two.

3. The lateral MOSFET of claim 1, wherein the series of overlapping diffused-dopant regions includes a number of diffused-dopant regions extending to decreasing depths along the lateral direction from the drain to the source.

4. The lateral MOSFET of claim 3, wherein the series of overlapping diffused-dopant regions includes at least two overlapping diffused-dopant regions.

5. The lateral MOSFET of claim 1, further comprising:
   a reduced surface field (RESURF) structure disposed below the drift structure in the drift region, the RESURF structure including a plurality of resurf diffused-dopant regions formed along the lateral direction from the drain to the source.

6. The lateral MOSFET of claim 5, wherein each of the plurality of resurf diffused-dopant regions in the RESURF structure is at a respective depth in the substrate, and wherein the depths of the plurality of resurf diffused-dopant regions in the RESURF structure decrease along the lateral direction from the drain to the source.

7. The lateral MOSFET of claim 5, wherein each of the plurality of resurf diffused-dopant regions in the RESURF structure have a respective dopant concentration, and wherein the dopant concentrations of the plurality of resurf diffused-dopant regions in the RESURF structure increase in steps along the lateral direction from the drain to the source.

8. The lateral MOSFET of claim 5, wherein the plurality of resurf diffused-dopant regions in the RESURF structure includes at least two resurf diffused-dopant regions in the RESURF structure.

9. The lateral MOSFET of claim 5, wherein each of the series of overlapping diffused-dopant regions in the drift structure has a width in the lateral direction, and is associated with one of the plurality of resurf diffused-dopant regions in the RESURF structure having a same width in the lateral direction.

10. The lateral MOSFET of claim 5, wherein each of the series of overlapping diffused-dopant regions in the drift structure has a width in the lateral direction, and is associated with one of the plurality of resurf diffused-dopant regions in the RESURF structure, and wherein at least one of the overlapping diffused-dopant regions in the drift structure and an associated resurf diffused-dopant region in the RESURF structure have different widths in a lateral direction.

11. The lateral MOSFET of claim 5, wherein at least one of the overlapping diffused-dopant regions in the series of overlapping diffused-dopant regions in the drift structure is not associated with any resurf diffused-dopant region in the RESURF structure.

12. The lateral MOSFET of claim 1, further comprising a reduced surface field oxide layer disposed on a surface of the substrate below a gate of the MOSFET.

13. The lateral MOSFET of claim 5, wherein the series of diffused-dopant regions in the drift structure have a first dopant type, and wherein the plurality of resurf diffused-dopant regions in the RESURF structure have a second dopant type opposite to the first dopant type.

14. A device comprising:
    a source; a source body, a gate, and a drain formed along a surface of a semiconductor substrate; and
    a drift region including a number of overlapping doped semiconductor regions having a stepped dopant concentration profile with dopant concentrations of a first dopant type increasing in steps along a lateral direction from the drain to the source of the device.

15. The device of claim 14 further comprising a reduced surface field oxide layer disposed on the surface of the semiconductor substrate below the gate.

16. The device of claim 14, wherein the number of overlapping doped semiconductor regions having a stepped dopant concentration profile include two or more lightly doped diffused-dopant regions having implanted dopants.

17. The device of claim 16, wherein the dopant concentrations in the two or more lightly doped diffused-dopant regions increase in steps in a horizontal direction from an edge of the drain to the source body in the device.

18. The device of claim 16, wherein the implanted dopants are n-type dopants.

19. The device of claim 14, further comprising: a reduced surface field (RESURF) structure having a stepped dopant concentration profile with dopant concentrations of a second dopant type increasing along a lateral direction from the drain to the source of the device.

20. The device of claim 19, wherein the RESURF structure includes one or more lightly doped diffused-dopant regions of the second dopant type confined to a region deeper than the number of overlapping doped semiconductor regions of the first dopant type.

* * * * *